(12) United States Patent
Tang et al.

(10) Patent No.: US 6,893,949 B2
(45) Date of Patent: May 17, 2005

(54) SEMICONDUCTOR DEVICES HAVING CONTACT PLUGS AND LOCAL INTERCONNECTS AND METHODS FOR MAKING THE SAME

(75) Inventors: Sanh D. Tang, Boise, ID (US); Daniel Smith, Boise, ID (US); Jason Taylor, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/696,165

(22) Filed: Oct. 28, 2003

(65) Prior Publication Data

US 2004/0084704 A1 May 6, 2004

Related U.S. Application Data

(62) Division of application No. 10/191,695, filed on Jul. 8, 2002, now Pat. No. 6,700,205, which is a division of application No. 09/875,421, filed on Jun. 5, 2001, now Pat. No. 6,479,377.

(51) Int. Cl.[7] ................. H01L 21/3205; H01L 21/4763; H01L 29/76; H01L 29/94; H01L 31/062
(52) U.S. Cl. ........................ 438/595; 438/618; 257/288
(58) Field of Search ................................ 438/595, 618; 257/288

(56) References Cited

U.S. PATENT DOCUMENTS

| | | |
|---|---|---|
| 5,807,776 A | 9/1998 | Tang |
| 5,834,805 A | 11/1998 | Tang |
| 5,858,285 A | 1/1999 | Manner et al. |
| 5,877,059 A | 3/1999 | Harward |
| 5,945,350 A | 8/1999 | Violette et al. |
| 5,977,578 A | 11/1999 | Tang |
| 6,117,793 A | 9/2000 | Tang |
| 6,143,649 A | 11/2000 | Tang |
| 6,160,296 A | 12/2000 | Violette et al. |
| 6,162,721 A | 12/2000 | Tang |
| 6,200,892 B1 | 3/2001 | Roberts et al. |
| 6,225,698 B1 | 5/2001 | Tang |
| 6,255,160 B1 | 7/2001 | Huang |
| 6,268,292 B1 | 7/2001 | Violette et al. |
| 6,274,409 B1 | 8/2001 | Choi |
| 2001/0002056 A1 * | 5/2001 | Manning ..................... 257/368 |

\* cited by examiner

*Primary Examiner*—Craig A. Thompson
*Assistant Examiner*—Nema Berezny
(74) *Attorney, Agent, or Firm*—Klarquist Sparkman, LLP

(57) ABSTRACT

Provided is, for example, a method for the fabrication of electrical interconnects in semiconductor devices wherein a substrate including two or more transistors having gate regions wherein the gate regions are not exposed (e.g., the gate regions are completely covered by an insulating cap) is provided. An insulating layer overlying the transistors and the active areas is deposited, where upon a hard mask is created and patterned to form a contact plug/interconnect opening over a first active area and a portion of a first transistor immediately adjacent the first active area. A spacer is formed within the contact plug/interconnect opening. Insulating material overlying active areas between transistors is removed. A portion of the gate region of the first transistor is then exposed and interconnect material is deposited within the contact plug/interconnect opening onto the exposed portion of the gate region of the first transistor and the first active area.

21 Claims, 5 Drawing Sheets

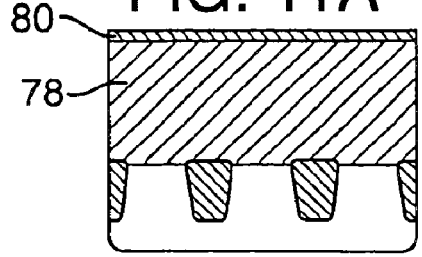
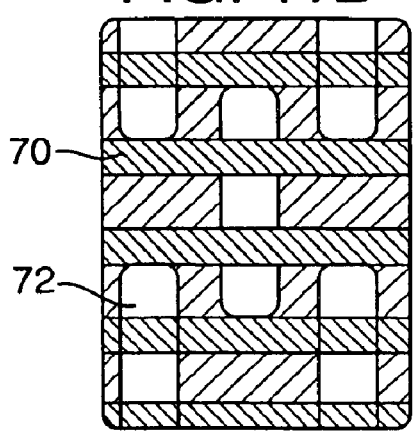
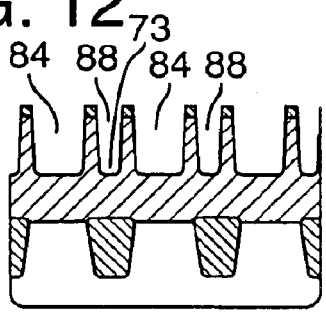
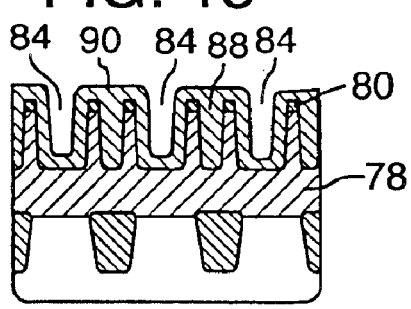
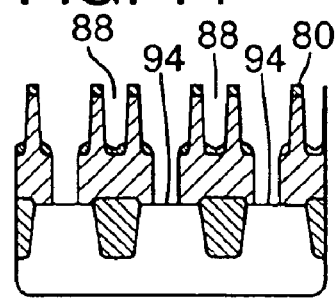
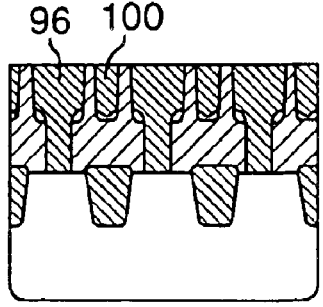
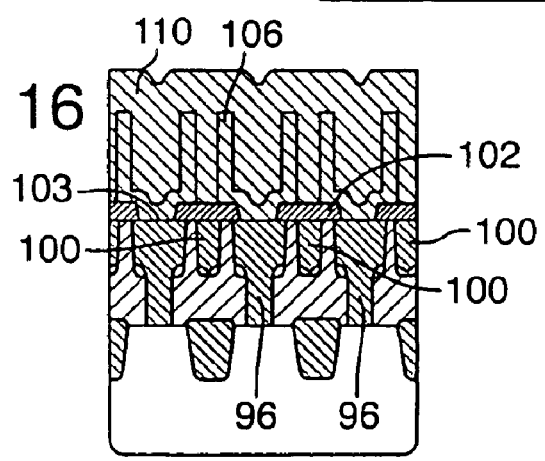

SEMICONDUCTOR DEVICES HAVING CONTACT PLUGS AND LOCAL INTERCONNECTS AND METHODS FOR MAKING THE SAME

PRIORITY CLAIM

This is a divisional application of U.S. application Ser. No. 10/191,695 filed Jul. 8, 2002 now U.S. Pat. No. 6,700,205, which is a divisional application of U.S. application Ser. No. 09/875,421 filed Jun. 5, 2001 (issued as U.S. Pat. No. 6,479,377), both of which are incorporated by reference herein.

FILED OF THE INVENTION

The present invention is related to semiconductor devices, and more particularly to semiconductor devices having local interconnects and contact plugs, such as logic devices, DRAMs, and SRAMs, and fabrication of the same.

BACKGROUND OF THE INVENTION

Various contacts and interconnects are formed in the fabrication of semiconductor devices. For example, in fabrication of static random access memories (SRAMs), local interconnects are used to increase packing density. SRAMs use local interconnections to connect its memory storage areas with its memory control areas and contact plugs to control its transistors. Dynamic random access memories (DRAMs) include memory cell arrays that store information and peripheral circuitry to control the memory cell array. The DRAM devices have cell contacts to peripheral circuitry. DRAMs may also use buried bit lines to contact the memory cell transistors in the DRAM arrays.

There are continuing goals in semiconductor fabrication to both reduce the number of masks or steps and to simplify steps needed to fabricate the contacts and interconnections for memory cells (e.g., contact plugs, local interconnects, and cell contacts in DRAMs, SRAMs and logic devices). Because the formation of interconnection in memory devices is complex and expensive, there is a need for methods that have fewer and simpler process steps to form the interconnections. Likewise, there is a continuing goal to shrink the memory cell size thereby maximizing density of the resulting chip.

For example, conventional (prior art) SRAM (or LSI logic device) fabrication processes require at least two mask steps to form the local interconnections and the contact plugs to the transistor gates (see prior art shown in FIGS. 1–4). Specifically, with reference to prior art FIG. 1, in such conventional processes, after formation of an array of transistors (typically field-effect transistors or FETs) 1, an insulating cap 2 is patterned (a first masking step for formation of the interconnections) and etched to expose a portion 3 of a transistor gate 4 for contact. An insulating layer 5 is deposited over the entire device and is planarized (prior art FIG. 2). Next, a second masking step must be performed. Namely, the insulating layer 5 must then be patterned and etched to form contact holes for the contact plugs 6 and a relatively wide trench 7 for the local interconnect (prior art FIG. 3). A self-aligned contact (SAC) etch or a pedestal etch must then be performed to ensure that the contact will not short to adjacent transistor gates.

The insulating layer 5 must be etched down to the transistor gate contact area 3 (see prior art FIGS. 2 and 3). Last, interconnect material is deposited to form the contact plugs 8 and local interconnect 9 (prior art FIG. 4). Since the conventional fabrication methods require that the etch stop when it reaches the insulating cap 2, the transistor contact plugs and the local interconnect cannot be formed at the same time. That is, to form the contact area 3 (prior art FIG. 3) of the local interconnect 9, there must be a first masking and etching step (as described above). A second mask and etch step is later performed to form the holes 6 for the contact plugs 8. Accordingly, two mask process steps are needed to form the contact plugs 8 and the local interconnect 9. (Thus, the contact plugs and contact for the local interconnect are not formed at the "same time" but require separate masking and etching steps.) Further, SAC etches or pedestal etches are required, making the process more complex.

Similar problems are encountered when fabricating cell contacts and buried bit lines in various semiconductor devices, such as DRAMs. Specifically, prior art methods typically follow the cell-over-bit line processes well known to those skilled in the art. Such prior art processes all require two separate masking steps to form cell contacts and the buried bit lines. Extra mask steps add significant cost and complexity to the fabrication process. Further, the prior art methods require that the contacts be defined between or through buried bit lines (see prior art FIG. 5). Accordingly, contact between the lower cell plate to the contact plug is difficult to define.

SUMMARY OF THE INVENTION

Provided herein are methods for the fabrication of electrical interconnects in semiconductor devices. In one embodiment of the invention, a substrate is provided. The substrate includes two or more transistors with active areas therebetween, the transistors having gate regions wherein the gate regions are not exposed (e.g., the gate regions are completely covered by an insulating cap). An insulating layer overlying the transistors and the active areas is then deposited, where upon a hard mask is created and patterned to form a contact plug/interconnect opening over a first active area and a portion of a first transistor immediately adjacent the first active area. A spacer is then formed within the contact plug/interconnect opening thereby forming two contact holes. Insulating material overlying one or more of the active areas is removed including material over the first active area such that the active areas are exposed. A portion of the gate region of the first transistor is then exposed and interconnect material is deposited within the contact plug/interconnect opening onto the exposed portion of the gate region of the first transistor and the first active area. Accordingly, the exposed portion of the gate region of the first transistor is electrically connected to the first active area (i.e., a contact plug/interconnect is formed).

Another embodiment of the present invention methods pertains to formation of electrical interconnects and buried bit lines in a semiconductor device. The method generally comprises providing a substrate having two or more transistors with active areas therebetween. An insulating layer overlying the transistors and active areas is next formed and a hard mask is deposited over the insulating layer. The hard mask is patterned to define cell contacts above the active areas and buried bit lines between the cell contacts. A portion of the insulating layer is preferably removed to form cell contact trenches and buried bit line trenches. Spacers may then be created to substantially fill the buried bit line trenches. Portions of the insulating layer within the cell contact trenches are next removed to expose the active areas as the cell contacts. The spacers are then partially or substantially recessed within the buried bit line trenches, conductive material is deposited over the recessed spacers to substantially fill the buried bit line trenches and within the cell contact trenches to form the same.

Several embodiments of semiconductor devices having such electrical interconnects made by the methods disclosed herein are also disclosed.

All of the specifically described methods and semiconductor devices are set forth for illustration of the methods and devices of the present invention. It is understood, however, that the present invention is not limited to those specifically described embodiments of the methods and devices.

BRIEF DESCRIPTION OF THE DRAWINGS

FIGS. 11–16 depict the process steps for fabrication of an embodiment of a DRAM memory device formed according to one embodiment of the methods of the invention.

DETAILED DESCRIPTION OF THE INVENTION

The methods described herein form interconnects and contact plugs in a variety of semiconductor devices using fewer masks and simpler process steps (simpler because no SAC etch or mask reduction are necessary) as compared to conventional fabrication methods. Thus, the present methods provide memory devices at greater throughput and lower cost. For example, by using the methods provided to form contact plugs or local interconnects for a semiconductor device such as a SRAM or a LSI logic device, only conventional etches are necessary, no SAC etches or pedestal etches are needed to form the contacts. Additionally, contacts, exhumed contacts, and local interconnects for SRAM and LSI logic devices are formed using a single mask to define and form the particular components.

When the methods provided herein are utilized to form cell contact plugs and buried bit lines for memory devices, such as DRAM devices, the masks for forming such structures (as required by the prior art) are eliminated. Specifically, the necessity of a separate mask for forming each the cell contact plugs and for forming the buried bit lines in the prior art, is eliminated. Thus, fewer masks allow less expensive and simpler processes for forming such devices.

Figure 5:
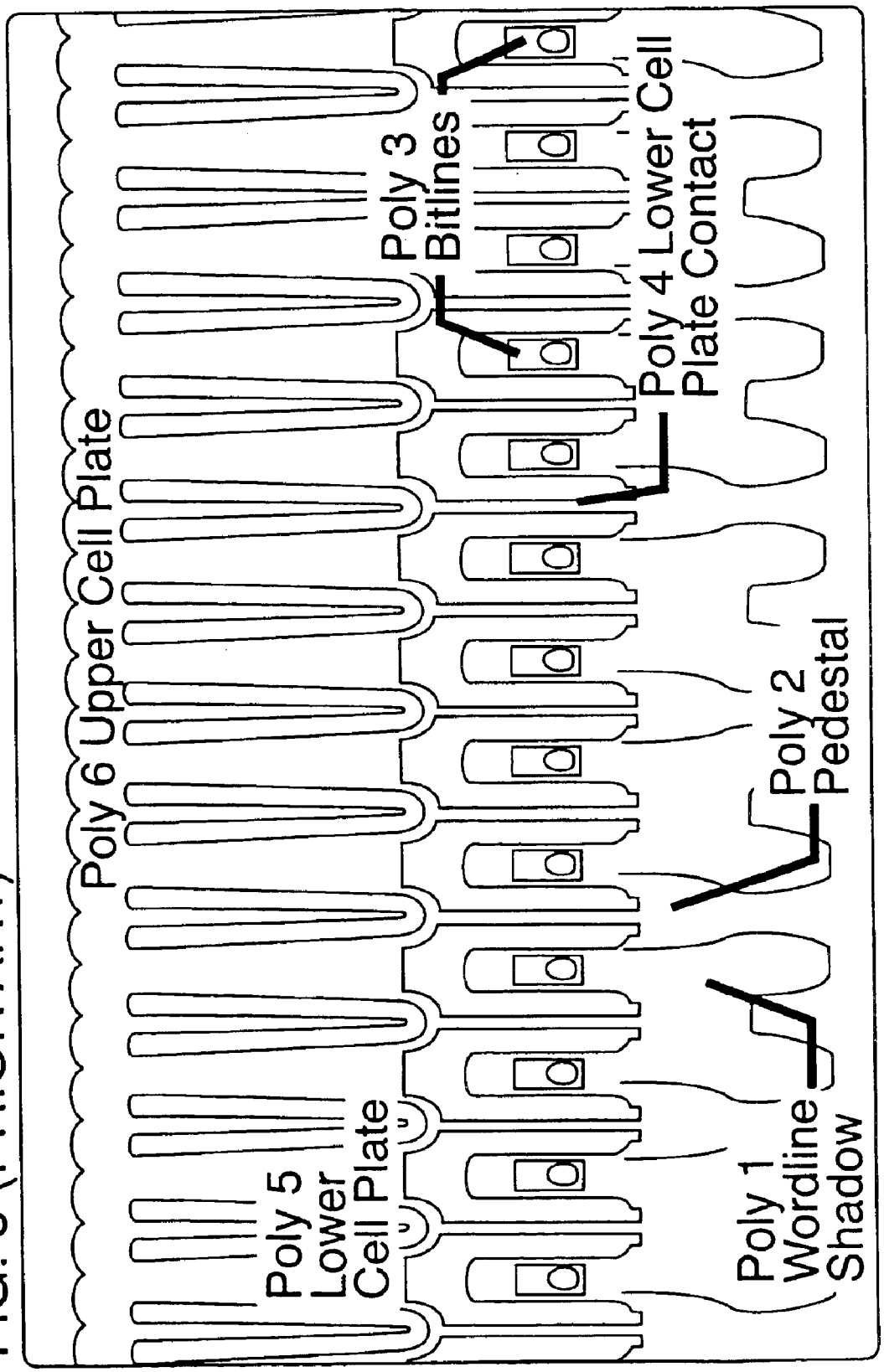
FIG. 5 depicts a portion of a prior art DRAM memory device made using the conventional COB (cell-over-bit line) process.

Additionally, presently described methods provide a simpler process for defining the contact between the lower cell plate and the cell plug (the prior art methods require the contact be defined between (or through) the buried bit lines (see prior art FIG. 5)). With the presently described methods, only approximately 1000 Å of an interlayer dielectric (ILD) typically need be etched to define the contact as compared to prior art methods. As a result, etch time and overall process time is reduced using the presently described methods to define cell contacts for devices such as DRAMs. Further, the contact is easily defined without the concern of shorting to the contact to the adjacent buried bit line. Alignment tolerance is also improved with the present process.

With the description as provided below, it is readily apparent to one skilled in the art that various processes described herein may be utilized in various configurations. For example, the present invention may be used in the formation of contacts, word lines, bit lines, local interconnections, etc. for various memory circuits. Exemplary SRAM and DRAM structures and methods for making the same are described below. It is to be understood, however, that these semiconductor structures and fabrication methods are only two examples of many possible structures and methods for practice of the present invention. For example, borophosphosilicate glass (BPSG) is used to form insulation between conductive materials. Other insulating materials may be used, such as phosphosilicate glass (PSG) or silicon dioxide ($SiO_2$). As another example, transistors other than FETs such as gallium arsenide MOSFETs (i.e., transistor types known to those persons skilled in the art) could be used. Also, as yet another example of a variation of the methods of the invention, dry or wet etching could be used for various etch steps.

Further, this invention may be used in any area of semiconductor fabrication where interconnects or contacts are desired between memory storage areas and logic or control circuitry. This invention is applicable to all areas of memory and memory access technology including, e.g., logic devices, RAM (e.g., DRAM, SRAM, SCRAM, EDRAM, VDRAM, NVSRAM, NVDRAM, DPSRAM, PSDRAM), ROM devices, and microprocessors.

All depositions, etches, reflows, etc. are performed by conventional methods (unless otherwise stated) as known to those persons skilled in the art. Likewise, as is understood by those skilled in the art, materials forming components of the described structures are not limited to those explicitly cited but may comprise any suitable material for the function performed by the component.

Figure 6A:
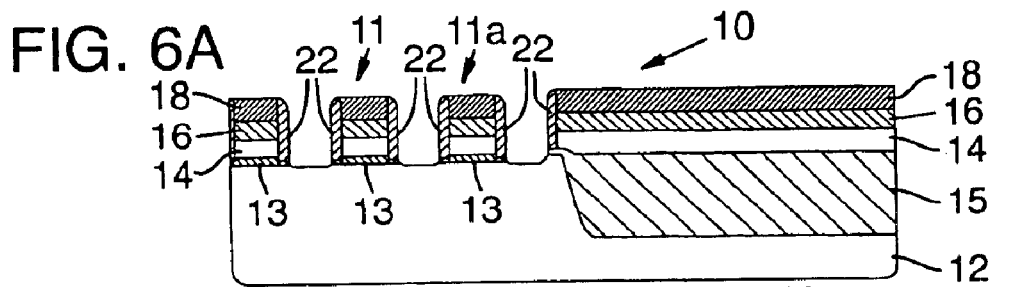
FIGS. 6A–10 depict the process steps for fabrication of an embodiment of a SRAM memory device formed according to one embodiment of the methods of the invention.
Figure 6B:
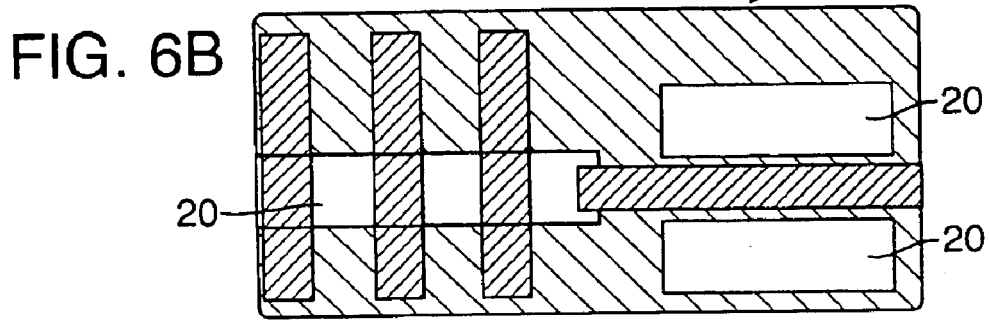

FIGS. 6A through 10, illustrate one embodiment of the present methods, used to form contact plugs and local interconnects in an embodiment of a semiconductor device (an SRAM device in this illustration) of the present invention. Conventional semiconductor fabrication processing, as known to those persons skilled in the art, is carried out to form the initial integrated circuit structure 10 as shown in FIG. 6A. The integrated circuit structure 10 may comprise, as shown, an array of field effect transistors (FETs). Those skilled in the art understand that certain features (not shown in FIGS. 6A–10) would also be present in such FET arrays, e.g., various p/n junctions, depletion regions, and the like. Active areas 20, however, are illustrated in plan view FIG. 6B of the FET array that is shown in cross-sectional view FIG. 6A.

As shown in the simplified FIG. 6A, each FET 11 may include a semiconductor substrate 12, lower gate oxide regions 13, first poly or conductive layers 14, FET gates 16, and insulating caps 18 (e.g., silicon nitride). The FETs 11 have insulating spacers 22. At least one of the FETs may comprise a shallow-trench isolated (STI) FET 11a having a shallow trench 15 formed beneath the first poly layer 14. In the STI FETs, a trench may be formed in the substrate 12 and subsequently filled with an oxide insulator material, and then polished back and isolated. STI FETs advantages and fabrication processes are described in a number of publications, and are generally described in publications such as U.S. Pat. No. 5,643,822 and B. Davari et al., IEDM 88 *Technical Digest*, Cat. No. 88 CH2528-8, pp. 92–95 (1988).

Substrate 12 is formed from any suitable material that may serve to form substrates for semiconductor devices.

Useful substrate materials include, but are not limited to, doped or undoped silicon, doped or undoped polycrystalline silicon, gallium arsenide, gallium phosphide, and indium phosphide. Lower gate oxide regions 13 (also referred to as field oxide regions) may comprise, e.g., an insulating material currently in use in the art as an insulator or a dielectric. Exemplary insulating materials to form field oxide regions include, but are not limited to tetraethyl orthosilicate (TEOS), nitrides, oxides, and polyimides.

The first poly layer 14 comprises any suitable material that conducts electric current. For example, poly layer 14 may comprise polycrystalline silicon, aluminum, copper, aluminum-copper alloys, aluminum-titanium alloys, gold, or the like. The material forming the FET gates 16 may comprise any highly electrically conductive material, such as a metal silicide (e.g., tungsten silicide, $WSi_x$, WSiN, WN, W). The insulating cap 18 and the insulating spacers 22 may comprise any suitable insulating material, such as silicon nitride ($SiN_x$).

Figure 7A:
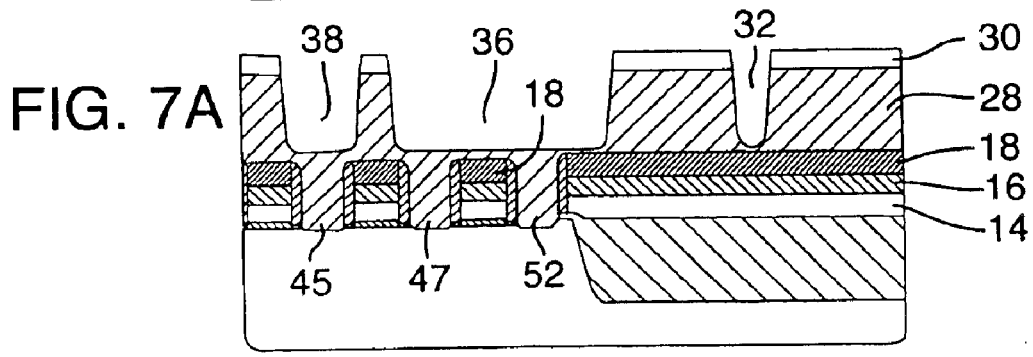
Figure 7B:
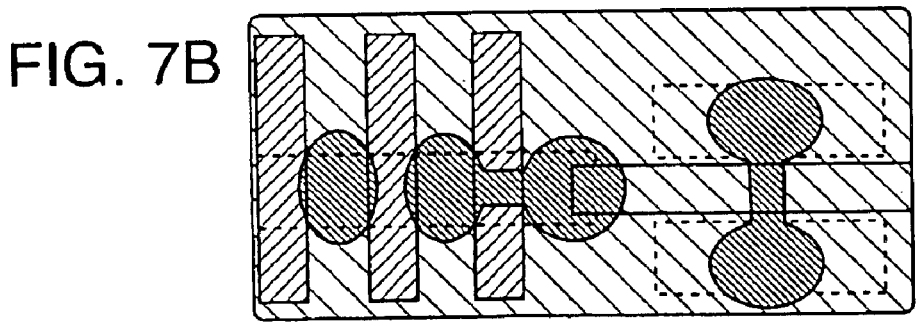

With reference to FIG. 7A, a thick insulating layer 28 (e.g., BPSG) is deposited to cover the FETs 11 and 11a of structure 10. The BPSG layer 28 need only be thick enough to provide suitable resistance between contact plugs (resistance levels as would be necessary for the particular device, as is known to those skilled in the art) and to fill the gaps between the FETs 11 and 11a. For example, the BPSG layer 28 may be about 10 KÅ in thickness. Other materials may be used to form layer 28, such as $TEOS/SiO_2$. The BPSG layer 28 is then preferably reflowed and planarized by chemical mechanical polishing (CMP) or other conventional means.

A hard mask or cap 30 (e.g., polycrystalline silicon) is then deposited to cover the planarized BPSG layer 28. The thickness of hard mask 30 depends upon the type of material used, as known to those skilled in the art. For example, if the hard mask 30 comprises polycrystalline silicon, it is preferably from about 1 to about 2 KÅ in thickness. If, however, the hard mask 30 comprises a tungsten compound, such as WN or $WSi_x$, the thickness may be from about 500 to about 1000 Å. The hard mask 30 is deposited over the BPSG layer 28.

The hard mask 30 is then patterned to define contact holes 36, 38 and local interconnect trench 32. Both the hard mask 30 and BPSG layer 28 are etched (by suitable means, e.g., insitu dry etch techniques). The etching of the BPSG layer 28 is stopped just before reaching the silicon nitride cap 18 (or simply without etching through the nitride cap). The BPSG layer 28 may alternatively be etched down to the nitride cap 18 defining the bottom of the contact holes 36, 38 and local interconnect trench 32. FIG. 7A is a plan view of the structure 10 illustrated in FIG. 7A. This first etch allows definition of the contact holes to be much larger than is actually necessary. This is helpful at least in part due to the limitations of current lithography capabilities.

Figure 8:
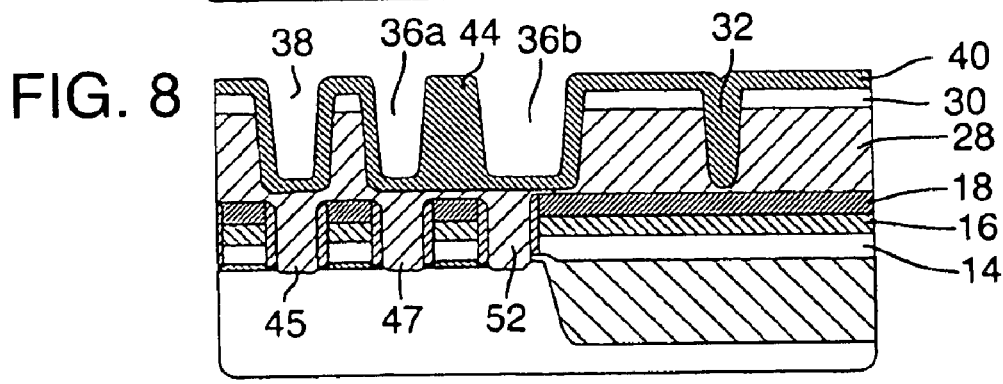

As shown in FIG. 8, a dielectric layer 40 (for example, silicon dioxide or TEOS) is deposited to cover remaining hard mask 30 and exposed portions of the BPSG layer 28. The TEOS layer 40 is deposited such that a spacer 44 is formed inside contact hole 36 forming contact holes 36a and 36b by filling in the narrow gap. I.e., if the space is 1500 Å a deposit of about 1000 Å of Teos will sufficiently pinch off the gap. Control of the TEOS spacer 44 dimensions allows definition of a relatively small contact area. For example, such will allow formation of a contact area that is smaller than about two times the TEOS spacer 44 thickness (see FIG. 9) as compared to the contact hole initially etched and as compared the such contacts formed in conventional SRAM devices. That is, the TEOS spacer "thickness" allows formation of the bottom of the contact area (lower contact area) to be smaller than that of the prior art. Smaller diffusion contacts prevent undesired electrical bridging to adjacent FET gates. Specifically, a smaller diffusion contact at the bottom (or lower area) of the contact prevents leakage or bridging between the plug and adjacent gates (as is typical on prior art devices). Smaller diffusion contacts also allow for smaller structures, reducing overall size and cost of a resulting memory device.

In such prior art devices interconnect fabrication methods rely on SAC or pedestal etches to form spacers such as spacer 44 in the present invention. Accordingly, the prior art processes require that polycrystalline silicon be used rather than TEOS to form such spacers. TEOS allows formation of spacers, e.g., spacer 44, that subsequently allow formation of a contact plug wherein the upper portion of the plug is larger than the lower portion. The prior art processes (where polycrystalline silicon is used rather than a TEOS spacer as in the present process) do not allow for formation of contact plugs wherein the upper portion is larger (wider) than the lower portion. Rather, prior art processes formed contact plugs wherein the upper and lower portions were of substantially identical dimensions. The larger upper portion of the contact plug of the device presently disclosed provides (among other advantages) the advantage of ease of formation of subsequent contacts on the upper portion of the contact plug.

Deposition of the dielectric layer 40 (e.g., TEOS) also partially fills contact hole 38 and substantially or completely fills local interconnect trench 32 (FIG. 8).

Figure 9:
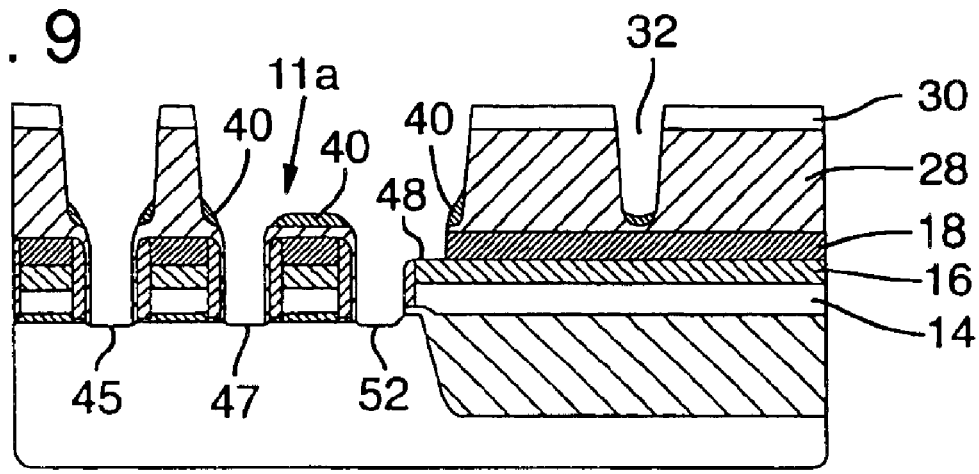
Figure 10:
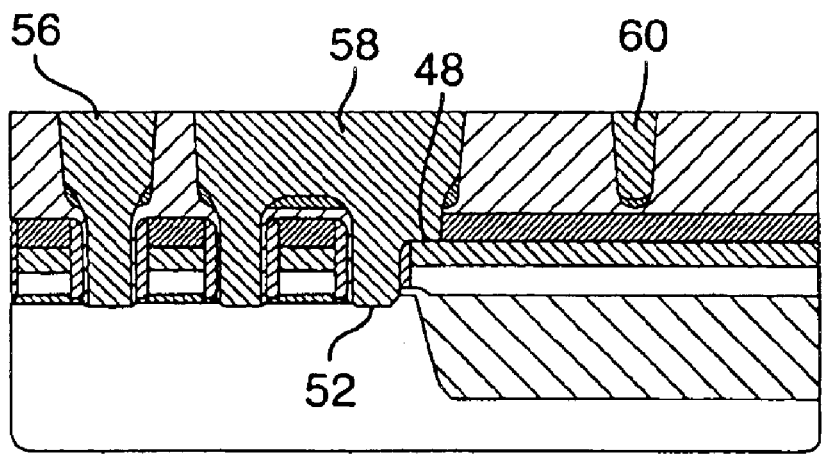

The TEOS and exposed portions of the BPSG layer are then etched to uncover the active areas 20 (FIGS. 6B and 9) and the FET gate contact 48 (FIG. 9). Additionally, such etching forms the trench 32 for formation of the local interconnect 60 (FIG. 10). Specifically, the TEOS layer 40 and exposed portions of the BPSG layer 28 are etched (using, e.g., a blanket oxide dry etch), see FIG. 9, with the poly cap 30 continuing to function as a hard mask. The TEOS spacer 44 is recessed; the TEOS spacer is recessed such that (at least) a sufficient amount of the insulator cap 18 remains to isolate the local interconnect or contact plug from shorting to the underlying FET gates 16. Some TEOS may remain (as shown in FIG. 9). The contact holes 38, 36a and 36b are cleared of TEOS layer 40 and all or substantially all BPSG layer 28 to uncover contact plug areas 45, 47, and 52. Further, at the same time, TEOS layer 40, exposed portions of BPSG layer 28, and nitride cap 30 overlying a portion 48 of the FET gate are etched to expose the FET gate for subsequent formation of the contact plug/local interconnection 58 (FIGS. 9 and 10).

Additionally, in this method, at the same time the contact plugs are being defined, the TEOS layer 40 in the local interconnect trench 32 is completely or substantially etched to define local interconnect 60 (FIGS. 9 and 10). Some TEOS may remain above FET 11a and remains (in this embodiment) in the interconnect trench 32. An embodiment of the present invention leaves about 300 or more TE OS within the local interconnect trench 32. The silicon nitride cap 18 within the narrow trench 32 (above FET 11a) preferably is not etched. Accordingly, the subsequent interconnect structure 60 will be formed without etching through the FET silicon nitride cap 18. The portion of the TEOS layer remaining in the local interconnect trench 32 prevents or substantially reduces shorting to the FET gate, as is typical when forming such devices using conventional fabrication methods, such as the SAC etch.

Figure 1B:
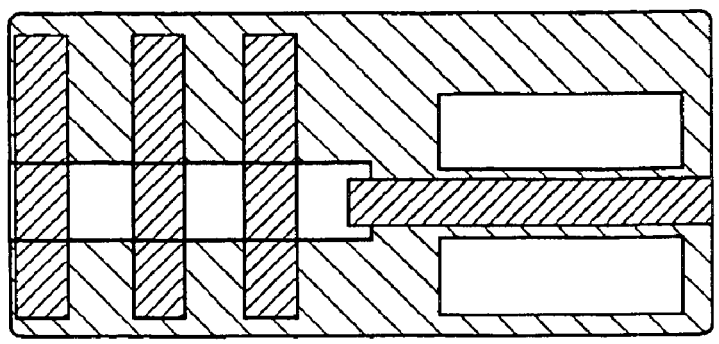
FIGS. 1A–4 depict prior art process steps for forming a SRAM memory device.
Figure 1A:
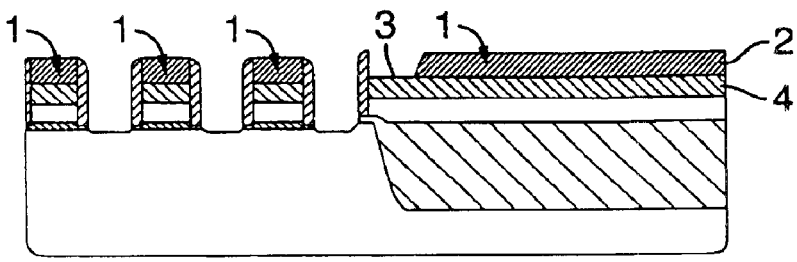
Figure 2:
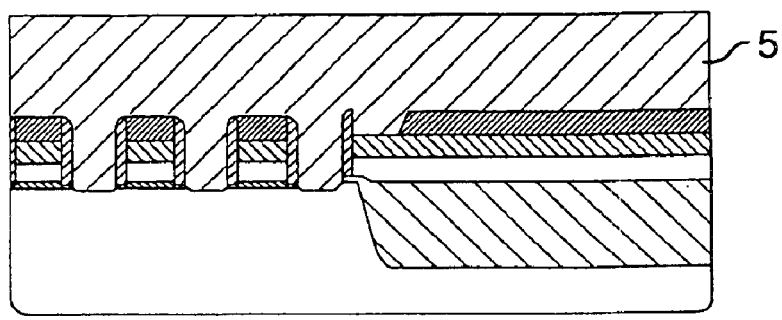
Figure 3:
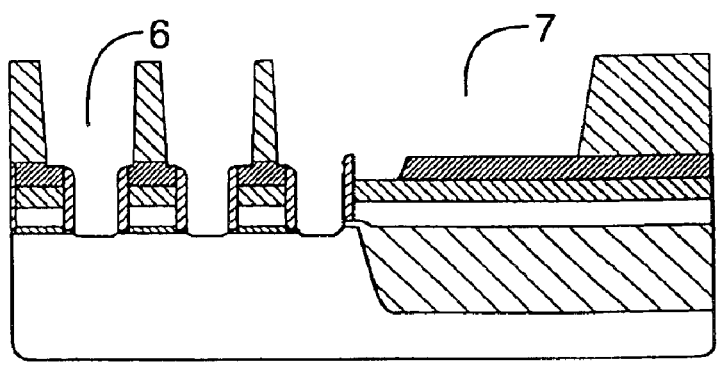
Figure 4:
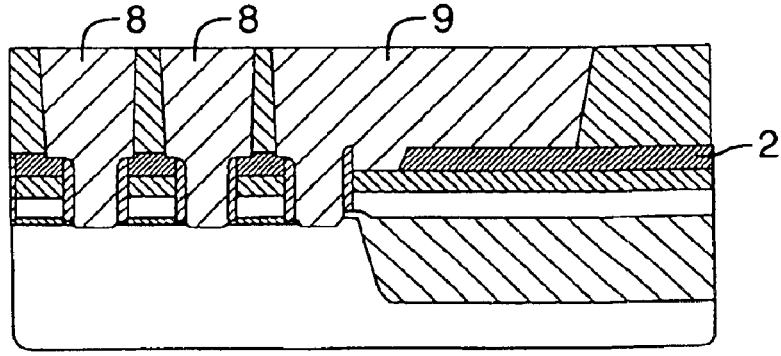

Moreover, the methods of this invention allow the local interconnect 60 (FIG. 10) and contact 48 to the FET gate to be formed with a single mask and etch. The prior art requires two masks to form the local interconnect and contact to the FET gate. Specifically, the prior art requires a first mask and etch to etch through the nitride cap 2 over a portion of the FET gate 4 (prior art FIG. 1) and then a second mask and etch after deposition of BPSG 5 (prior art FIGS. 2 and 3). Because the prior art process only works for an etch that can stop when reaching the silicon nitride cap, forming the FET gate contact and the local interconnect at the same time (as in the present method) is not possible with the prior art methods.

With reference to FIG. 10, any suitable interconnect material is deposited to form contact plug 56, contact plug 58 (i.e., contact plug 58/local interconnect to exhumed contacts 48 and 52), and local interconnect 60. The interconnect material may comprise, for example, tungsten with a titanium, titanium nitride, tantanum nitride, tungsten nitride or WSi$_x$ liner. Hard mask 30 is etched away. CMP, etch back, or other suitable means may be used to complete formation of the contact plugs 52, 58 and local interconnect 60 following deposition of the interconnect material and removal of hard mask 30. If desired, a CoSi$_x$ layer (or other suitable material) may be deposited over the interconnect material to provide low resistance contact plugs and local interconnect.

With reference to FIGS. 11A through 16, an embodiment of the present methods is demonstrated through formation of contacts and buried bit lines in DRAM arrays. With reference to FIG. 11A, first, as described above, STI/FETs are formed by conventional means as known to those skilled in the art. Word lines 70 pass over active areas 72 (field oxide regions) to function as gate electrode and over gate dielectric layers overlying active regions 72 to function as the field effect transistor (FIG. 11B). A thick layer 78 of insulating material (e.g., BPSG 78) is deposited over the entire device, as is shown in FIG. 11A. The insulating layer 78 should be thick enough to provide a reasonable resistance for the to-be-formed buried bit lines, for example, about 10 KÅ. Other materials may be used to form layer 78, such as TEOS/SiO$_2$. The BPSG 78 is reflowed and planarized by any suitable means as known to those skilled in the art.

A hard mask or cap 80 (e.g., polycrystalline silicon) is then deposited to cover the planarized BPSG (FIGS. 11A). The thickness of hard mask 80 depends on the type of material used. For example, if the hard mask 80 comprises polycrystalline silicon, it is preferably from about 1 to about 2 KÅ in thickness. If, however, the hard mask 80 comprises a tungsten compound, such as WN or WSi$_x$, the thickness may be from about 500 to about 1000 Å. The hard mask 80 is deposited over the BPSG layer 78 and is patterned to define cell contact trenches 84, bit line contacts 73 and buried bit line trenches 88 (FIG. 12A).

Referring to FIG. 12A, the hard mask 80 is etched to form the bit line contacts 73 and cell contacts trenches 84 and the bit line trenches 88. The cell contacts may be patterned to be much smaller than conventional cell contacts. As discussed above, the contact plug used as a "landing" in the prior art is not necessary in the present method. Such larger contacts were necessary in the prior art devices since the contacts were defined between the buried bit lines. The prior art required larger contact areas to provide for the necessary alignment tolerance. As discussed below, unlike the prior art methods, in this embodiment of the present method a thin TEOS layer 102 defines the cell contact area so a smaller cell contact may be formed. The patterned hard mask 80 is etched through to the BPSG layer 78. BPSG layer 78 is only partially etched (about 50%) forming cell contact trenches 84 and bit line trenches 88. FIG. 12B is a plan view of the device shown in cross section in FIG. 12A.

As shown in FIG. 13A, a silicon dioxide or TEOS layer 90 is deposited to cover remaining hard mask 80 and exposed portions of BPSG layer 78. The TEOS layer 90 is deposited such that spacers are formed in the cell contact trenches 84 and bit line trenches 88 to form exceptionally small final contact diffusion areas. The TEOS layer 90 is deposited (by different spacing as known to persons skilled in the art) to partially fill cell contacts trenches 88. The TEOS layer 90 deposited in the bit line trenches 88 will be etched to form buried bit lines (FIGS. 13A and B).

The TEOS layer 90 is etched by suitable etching means, such as a blanket oxide etch. The hard mask 80 remains, as does the BPSG layer 78 under the hard mask (FIG. 14). The TEOS layer 90 and BPSG layer 78 in the cell contact trenches 88 are completely etched to leave the cell contact diffusion region 94 exposed. A small portion (about 0–500 Å or an amount such that layer 90 and 78 are not completely removed) of the TEOS layer 90 is left remaining in the bit line trenches 88. The bit line trench 88 is recessed without reaching the lower conductive layer 78 therein.

As shown in FIG. 15, remaining hard mask 80 is removed and any suitable interconnect material is deposited to form cell contact plugs 96 and bit lines 100. The interconnect material may comprise, for example, tungsten with a tungsten nitride liner, Ti/TiN, CoSi$_x$ or a WSi$_x$ liner. CMP, etch back or other suitable means as known to those skilled in the art may be used to complete formation of the cell contact plugs 96 and bit lines 100 following deposition of the interconnect material. If desired, a CoSi$_x$ layer (or other suitable material) may be deposited over the interconnect material to provide lower resistance cell contact plugs and bit line plugs.

As shown in FIG. 16, the cell is then completed (by conventional means) over the bit lines and contact plugs. Specifically, layers of TEOS 102 are formed over the buried bit lines 100. Lower cell plates 106 are formed over the cell contact plugs 96, through cell contact 103 and a portion on either end of each TEOS layer 102. Upper cell plates 110 are formed to cover both the lower cell plates 106 and the still exposed portions of the TEOS layer 102.

Whereas the invention has been described with reference to multiple embodiments of the apparatus and representative methods, it will be understood that the invention is not limited to those embodiments and representative methods. On the contrary, the invention is intended to encompass all modifications, alternatives, and equivalents as may be included within the spirit and scope of the invention as defined by the appended claims.

What is claimed is:

1. A method of forming electrical interconnects and buried bit lines in a semiconductor device comprising:

providing a substrate having two or more transistors with active areas therebetween;

creating an insulating layer overlying the transistors and active areas;

forming a hard mask over the insulating layer;

patterning the hard mask to define cell contacts above the active areas and buried bit lines between the cell contacts;

removing a portion of the insulating layer to form cell contact trenches and buried bit line trenches;

depositing spacers to substantially fill the buried bit line trenches;

removing portions of the insulating layer within the cell contact trenches to expose the active areas underlying the cell contacts;

recess the spacers within the buried bit lines; and deposit conductive material within the buried bit line trenches and the cell contact trenches.

2. A semiconductor device made according to the process of claim 1.

3. The method of claim 1, wherein the spacers comprise TEOS or silicon dioxide.

4. The method of claim 1, wherein the hard mask comprises polycrystalline silicon.

5. The method of claim 4, wherein the hard mask has a thickness from about 1000 angstroms to about 2000 angstroms.

6. The method of claim 1, wherein the hard mask comprises a tungsten compound.

7. The method of claim 6, wherein the hard mask has a thickness from about 500 angstroms to about 1000 angstroms.

8. A method of forming electrical interconnects and buried bit lines in a semiconductor device comprising:

providing a substrate having two or more FET transistors with active areas therebetween;

creating an insulating layer overlying the transistors and active areas;

patterning the insulating layer to define cell contacts above the active areas and buried bit lines between the cell contacts;

removing a portion of the insulating layer to form cell contact trenches and buried bit line trenches;

depositing dielectric material to form spacers within the buried bit line trenches and a dielectric layer within the cell contact trenches;

removing the dielectric material and portions of the insulating layer within the cell contact trenches to expose the active areas underlying the cell contacts while recessing the spacers within the buried bit lines; and depositing conductive material within the buried bit line trenches and the cell contact trenches.

9. A semiconductor device made according to the process of claim 8.

10. The method of claim 8, wherein the spacers comprise TEOS or silicon dioxide.

11. The method of claim 8, wherein the hard mask comprises polycrystalline silicon.

12. The method of claim 11, wherein the hard mask has a thickness from about 1000 angstroms to about 2000 angstroms.

13. The method of claim 8, wherein the hard mask comprises a tungsten compound.

14. The method of claim 13, wherein the hard mask has a thickness from about 500 angstroms to about 1000 angstroms.

15. A method of forming electrical interconnects and buried bit lines in a semiconductor device comprising:

providing a substrate having two or more shallow-trench insulated transistors with active areas therebetween and word lines traversing the active areas;

creating an insulating layer overlying the transistors, active areas and word lines;

patterning the insulating layer to define cell contacts above the active areas and buried bit lines above shallow trenches of the transistors;

removing a portion of the insulating layer to form cell contact trenches and buried bit line trenches;

depositing dielectric material to form spacers within the buried bit line trenches and a dielectric layer within the cell contact trenches;

removing the dielectric material and portions of the insulating layer within the cell contact trenches to expose the active areas underlying the cell contacts while partially removing the spacers within the buried bit lines; and depositing conductive material within the buried bit line trenches and the cell contact trenches.

16. The method of claim 15, wherein the spacers comprise TEOS or silicon dioxide.

17. A semiconductor device made according to the process of claim 15.

18. The method of claim 15, wherein the bard mask comprises polycrystalline silicon.

19. The method of claim 18, wherein the hard mask has a thickness from about 1000 angstroms to about 2000 angstroms.

20. The method of claim 15, wherein the hard mask comprises a tungsten compound.

21. The method of claim 20, wherein the hard mask has a thickness from about 500 angstroms to about 1000 angstroms.

* * * * *

UNITED STATES PATENT AND TRADEMARK OFFICE
CERTIFICATE OF CORRECTION

PATENT NO. : 6,893,949 B2  
DATED : May 17, 2005  
INVENTOR(S) : Tang et al.

It is certified that error appears in the above-identified patent and that said Letters Patent is hereby corrected as shown below:

Column 1,  
Line 14, "Filed" should be -- Field --.

Column 3,  
Line 50, "each the cell" should be -- each of the cell --.

Column 5,  
Line 62, "Teos" should be -- TEOS --.

Column 6,  
Line 1, "compared the such" should be -- compared to such --.  
Line 59, "TE OS" should be -- TEOS --.

Column 7,  
Line 56, "contacts" should be -- contact --.

Column 8,  
Line 12, "contacts" should be -- contact --.

Column 10,  
Line 38, "bard" should be -- hard --.

Signed and Sealed this

Twenty-first Day of March, 2006

JON W. DUDAS  
*Director of the United States Patent and Trademark Office*